United States Patent [19]
Yabe

[11] Patent Number: 5,164,907
[45] Date of Patent: Nov. 17, 1992

[54] COMPUTER AIDED DESIGN SYSTEM CAPABLE OF PLACING FUNCTIONAL BLOCKS WITH A CIRCUIT CONSTRAINT SATISFIED

[75] Inventor: Shoji Yabe, Tokyo, Japan
[73] Assignee: NEC Corporation, Tokyo, Japan
[21] Appl. No.: 479,679
[22] Filed: Feb. 14, 1990

[30] Foreign Application Priority Data
Feb. 15, 1989 [JP] Japan ................................. 1-35874

[51] Int. Cl.⁵ .............................................. G06F 15/20
[52] U.S. Cl. ..................................... 364/491; 364/489
[58] Field of Search ................ 364/488, 489, 490, 491

[56] References Cited

U.S. PATENT DOCUMENTS

| | | | |
|---|---|---|---|
| 3,653,071 | 3/1972 | Hill et al. ............................ | 364/490 |
| 4,612,618 | 9/1986 | Pryor et al. ...................... | 364/488 X |
| 4,636,966 | 1/1987 | Yamada et al. ..................... | 364/491 |
| 4,754,408 | 6/1988 | Carpenter et al. .............. | 364/488 X |
| 4,815,003 | 3/1989 | Putatunda et al. .............. | 364/488 X |
| 4,896,272 | 1/1990 | Kurosawa ........................... | 364/491 |

OTHER PUBLICATIONS

Robson, Gary, "Automatic Placement and Routing of Gate Arrays", VLSI Design, Apr., 1984, pp. 35-36, 38-40, and 42-43.

Primary Examiner—Parshotam S. Lall
Assistant Examiner—Edward R. Cosimano
Attorney, Agent, or Firm—Foley & Lardner

[57] ABSTRACT

A system and method for logic circuit design in which functional blocks are placed on a substantially plane area in compliance with logic connection information under a circuit constraint. Critical nets are first extracted from logic connection information and then, critical blocks connected to the critical nets are extracted from the logic connection information. The critical blocks are initially placed on the substantially plane area to provide an initial critical block placement result. The initial critical block placement result is iteratively improved until the circuit constraint is satisfied.

6 Claims, 2 Drawing Sheets

COMPUTER AIDED DESIGN SYSTEM CAPABLE OF PLACING FUNCTIONAL BLOCKS WITH A CIRCUIT CONSTRAINT SATISFIED

BACKGROUND OF THE INVENTION

This invention relates to a computer aided design system for designing a logic circuit comprising a plurality of functional blocks connected through path nets to one another. More particularly, this invention relates to a placement method for placing the functional blocks on a substantially plane area in response to logic connection information indicative of a connection between the functional blocks under a circuit constraint.

In a computer aided design system, it is necessary to place functional blocks of a logic circuit on a substantially plane area. Each of the functional blocks is a logic functional unit such as a gate, a flip-flop, or the like. The functional blocks are connected through path nets to one another. The logic circuit may be a large-scale integrated circuit (LSI) or a very large-scale integrated circuit (VLSI). The substantially plane area may be a chip or a printed circuit board.

Such a placement method is disclosed in an article contributed by Gary Robson to VLSI DESIGN, April, 1984, pages 35 to 43, under the title of "Automatic Placement and Routing of Gate Arrays". The placement method comprises an initial placement step and an iterative improvement step. At the initial placement step, the functional blocks are initially placed on the substantially plane area to provide an initial placement result. At the iterative improvement step, the initial placement result is iteratively improved in order to improve both its speed and the routability of its product. The path nets are divided into critical or crucial nets and normal nets. The critical nets are considered more important in the overall substantially plane area than the normal nets. The critical nets connect those parts of the functional blocks which are called critical blocks. It is necessary to satisfy a circuit constraint with regard to the critical nets. The circuit constraint is, for example, dependent on path lengths and/or path crossovers. In order to provide a final placement result so that the circuit constraint is satisfied, placement of the critical blocks is improved with the critical nets weighted.

As mentioned above, all of the functional blocks are initially placed on the substantially plane area to provide the initial placement result at the initial placement step of the conventional placement method no matter whether the functional blocks are the critical blocks or not. Accordingly, it is difficult to emphasize a critical connection under the circuit constraint. As a result, the conventional placement method is disadvantageous in that it is difficult to provide the final placement result so that the circuit constraint is satisfied despite the fact that the critical nets are weighted. Such a difficulty has lately become more and more evident with large scale integration of the logic circuits such as the LSI.

SUMMARY OF THE INVENTION

It is an object of this invention to provide a computer aided design system and a method of placing functional blocks on a substantially plane area, wherein providing a final placement result in consideration of a circuit constraint is facilitated.

Other objects of this invention will become clear as the description proceeds.

A method to which this invention is applicable is for designing a logic circuit comprising a plurality of functional blocks connected through path nets to place the functional blocks on a substantially plane area in response to logic connection information under a circuit constraint. The logic connection information indicates connections between the functional blocks. According to this invention, the above-mentioned method comprises the steps of extracting critical nets comprising predetermined parts of the path nets from the logic connection information, of extracting critical blocks connected to the critical nets from the logic connection information, of initially placing the critical blocks on the substantially plane area to provide an initial critical block placement result, of checking whether or not the initial critical block placement result satisfies the circuit constraint, and of iteratively improving the initial critical block placement result until the circuit constraint is satisfied. The above-mentioned method may further comprise the steps of initially placing normal blocks identical with the functional blocks except for the critical blocks on the substantially plane area to provide an initial normal block placement result, and of improving the initial normal block placement result.

A computer aided design system to which this invention is applicable, is for designing a logic circuit comprising a plurality of functional blocks connected through path nets to one another to place the functional blocks on a substantially plane area in response to logic connection information and under a circuit constraint. The logic connection information indicates connection between the functional blocks. According to this invention, the computer aided design system comprises: logic connection information memorizing means for memorizing the logic connection information as stored logic connection information; critical net extracting means connected to the logic connection information memorizing means for extracting, as critical nets, predetermined parts of the path nets from the stored logic connection information to produce critical net information indicative of the critical nets; critical net memorizing means connected to the critical net extracting means for memorizing the critical net information as stored critical net information; critical block extracting means connected to the logic connection information memorizing means and to the critical net memorizing means for extracting critical blocks connected to the critical nets from the stored logic connection information in accordance with the stored critical net information to produce critical block information indicative of the critical blocks; critical block initial placing means connected to the critical block extracting means and to the critical net memorizing means for carrying out initial placement of the critical blocks on the substantially plane area in accordance with the stored critical net information to produce initial critical block placement result information indicative of an initial critical block placement result; critical block placement result memorizing means connected to the critical block initial placing means for memorizing, as stored critical block placement result information, one of the initial critical block placement result information and improved critical block placement result information at a time; circuit constraint memorizing means for memorizing circuit constraint information indicative of the circuit constraint as stored circuit constraint information; critical block placement result checking means connected to the critical block placement result memorizing means and to the circuit constraint memorizing means for using the stored circuit constraint information in checking whether or not the stored critical block placement result information satisfies the circuit constraint, the critical block placement result checking means producing improvement indication information when the stored critical block placement result information does not satisfy the circuit constraint; iterative critical block placement improving means connected to the critical block placement result checking means and to the critical block placement result memorizing means for iteratively improving the stored critical block placement result information in response to the improvement indication information to produce a specific one of the improved critical block placement result information that indicates an improved critical block placement result; and supplying means connected to the iterative critical block placement improving means and to the critical block placement result memorizing means for supplying the critical block placement result memorizing means with the specific one of the improved critical block placement result information. The critical block placement result checking means produces circuit constraint satisfaction information when the stored critical block placement result information satisfies the circuit constraint. The computer aided design system further comprises normal block initial placing means connected to the critical block placement result checking means and to the logic connection information memorizing means for carrying out initial placement of normal blocks identical with the functional blocks except for the critical blocks on the substantially plane area to provide initial normal block placement result information indicative of an initial normal block placement result; and normal block placement improving means connected to the normal block initial placing means for improving the initial normal block placement result information.

DESCRIPTION OF THE PREFERRED EMBODIMENTS

Figure 1:
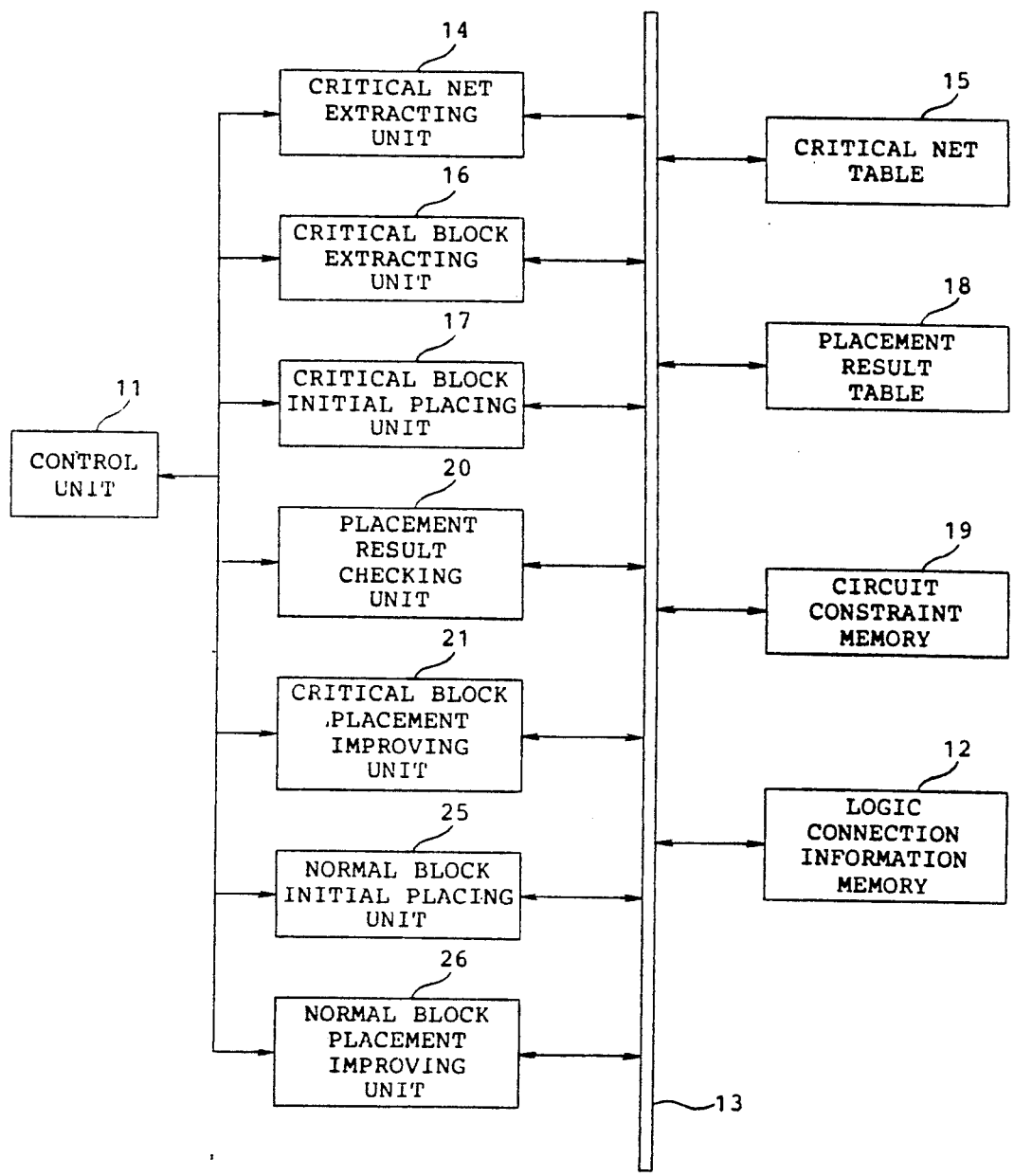
FIG. 1 is a block diagram of a computer aided design system according to an embodiment of this invention.

Referring to FIG. 1, a computer aided design system according to a preferred embodiment of this invention is for designing a logic circuit comprising a plurality of functional blocks connected through path nets to one another to place the functional blocks on a substantially plane area in compliance with logic connection information under a circuit constraint. The logic connection information indicates connection between the functional blocks.

Each of the functional blocks is a logic functional unit such as a gate, a flip-flop, or the like. The logic circuit may be a large-scale integrated circuit (LSI) or a very large-scale integrated circuit (VLSI). The substantially plane area may be a chip or a printed circuit board and will later be illustrated.

The path nets are divided into critical or crucial nets and normal nets. The critical nets are considered more important in the overall substantially plane area than the normal nets. The critical nets connect those parts of the functional blocks which are called critical blocks. It is necessary to satisfy a circuit constraint with regard to the critical nets. The circuit constraint is, for example, dependent on path lengths and/or path crossovers.

The computer aided design system comprises a control unit 11 for controlling other units of the computer aided design system that will later be described in detail.

The computer aided design system comprises a logic connection information memory 12 for preliminarily memorizing the logic connection information as stored logic connection information. In this embodiment, the logic connection information memory 12 preliminarily memorizes the logic connection information with the logic connection information divided into critical net information indicative of the critical nets and normal net information indicative of the normal nets.

The logic connection information memory 12 is connected through a bus 13 to a critical net extracting unit 14. The critical net extracting unit 14 extracts the critical nets from the stored logic connection information under the control of the control unit 11. The critical net extracting unit 14 produces the critical net information. The critical net information is delivered to a critical net table 15 through the bus 13.

Supplied with the critical net information from the critical net extracting unit 14, the critical net table 15 memorizes the critical net information as stored critical net information. In other words, the critical net extracting unit 14 outputs the critical net information into the critical net table 15 for storage as the stored critical net information. The critical net table 15 is connected to a critical block extracting unit 16 through the bus 13.

The critical block extracting unit 16 is connected to the logic connection information memory 12 through the bus 13. The critical blocks connected to the critical nets are extracted by the critical block extracting unit 16 from the stored logic connection information in accordance with the stored critical net information under the control of the control unit 11. The critical block extracting unit 16 produces critical block information indicative of the critical blocks. The critical block information is supplied to a critical block initial placing unit 17 through the bus 13.

The critical block initial placing unit 17 is connected to the critical net table 15 through the bus 13. The critical block initial placing unit 17 carries out initial placement of the critical blocks on the substantially plane area in accordance with the stored critical net information under the control of the control unit 11. The critical block initial placing unit 17 produces initial critical block placement result information indicative of an initial critical block placement result. The initial critical block placement result information is delivered to a placement result table 18 through the bus 13.

The placement result table 18 memorizes the initial critical block placement result information as stored critical block placement result information. That is, the critical block initial placing unit 17 outputs the initial critical block placement result information into the placement result table 18 for storage as the stored critical block placement result information.

The computer aided design system further comprises a circuit constraint memory 19 connected to the bus 13. The circuit constraint memory 19 preliminarily memorizes circuit constraint information indicative of a circuit constraint as stored circuit constraint information. The circuit constraint memory 19 is connected to a placement result checking unit 20 through the bus 13.

The placement result checking unit 20 is connected to the placement result table 18 through the bus 13. The placement result checking unit 20 is for using the stored circuit constraint information under the control of the control unit 11 in checking whether or not the stored critical block placement result information satisfies the circuit constraint. The placement result checking unit 20 produces improvement or rearrangement indication information when the stored critical block placement result information does not satisfy the circuit constraint. The improvement indication information is supplied to a critical block placement improving unit 21.

The iterative critical block placement improving unit 21 is connected to the placement result table 18 through the bus 13. The critical block placement improving unit 21 improves the stored critical block placement result information in response to the improvement indication information under the control of the control unit 11. The critical block placement improving unit 21 produces improved critical block placement result information indicative of an improved critical block placement result. The improved critical block placement result information is supplied to the placement result table 18 through the bus. The improved critical block placement result information is stored in the placement result table 18 as the stored critical block placement result information. The placement result checking unit 20 is for again checking whether or not the stored critical block placement result information in question satisfies the circuit constraint.

The above-mentioned processing by the placement result checking unit 20 and the critical block placement improving unit 21 is iteratively carried out until the circuit constraint is satisfied. At any rate, the placement result table 18 acts as a critical block placement result memorizing arrangement for memorizing, as the stored critical block placement result information, one of the initial critical block placement result information and the improved critical block placement result information at a time. The critical block placement improving unit 21 serves as an iterative critical block placement improving arrangement for iteratively improving the stored critical block placement result information in response to the improvement indication information to produce a specific one of the improved critical block placement result information at a time. The bus 13 is operable as a supplying arrangement connected to the iterative critical block placement improving arrangement and to the critical block placement result memorizing arrangement for supplying the critical block placement result memorizing arrangement with the specific one of the improved critical block placement result information at a time. Finally, final critical block placement result information indicative of a final critical block placement result is stored in the placement result table 18 when the circuit constraint is satisfied.

Figure 2:
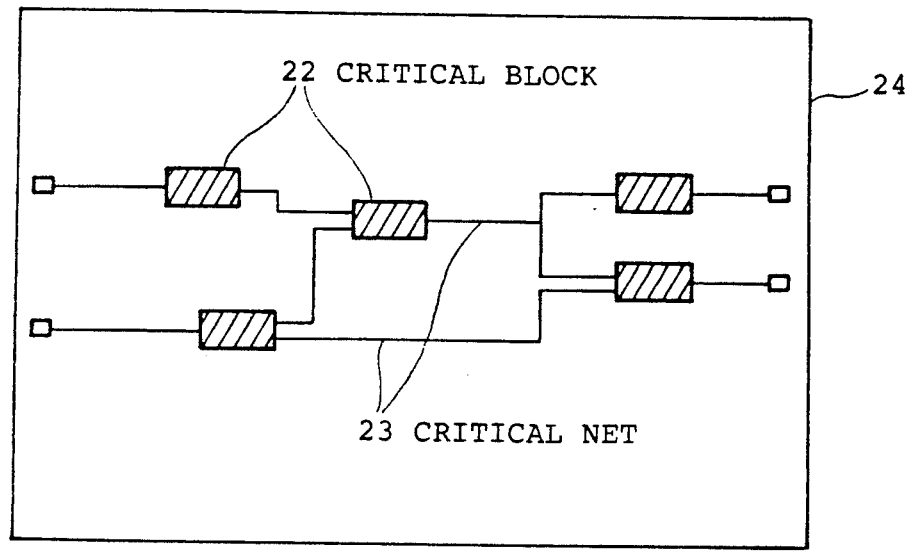
FIG. 2 shows the state of a placement condition when placement of critical blocks is completed.

Turning to FIG. 2, an example of the final critical block placement result is illustrated. The final critical block placement result represents final placement of the critical blocks connected to critical nets on the substantially plane area. In FIG. 2, each of the critical blocks, each of the critical nets, and the substantially plane area are depicted at 22, 23, and 24, respectively. Each critical block 22 is represented by a shaded or hatched block in FIG. 2. It is noted that the critical nets 23 do not indicate actual wiring but only indicate connections between the critical blocks 22.

Turning back to FIG. 1, the placement result checking unit 20 produces circuit constraint satisfaction information when the stored critical block placement result information satisfies the circuit constraint. The circuit constraint satisfaction information is supplied to a normal block initial placing unit 25.

The normal block initial placing unit 25 is connected to the logic connection information memory 12 through the bus 13. The normal block initial placing unit 25 carries out initial placement of normal blocks on the substantially plane area under the control of the control unit 11 to provide initial normal block placement result information indicative of an initial normal block placement result. The normal blocks are those of the functional blocks which are other than the critical blocks. The initial normal block placement result information is delivered to a normal block placement improving unit 26 through the bus 13.

The normal block placement improving unit 26 iteratively improves the initial normal block placement result information under the control of the control unit 11 in the manner known in the art. Finally, final normal block placement result information indicative of a final normal block placement result is stored in the placement result table 18. Under the circumstances, a combination of the normal block initial placing unit 25 and the normal block placement improving unit 26 carries out placement of the normal blocks on the substantially plane area in consideration of the final critical block placement result information which is already stored in the placement result table 18.

Inasmuch as such a placement method is known in the art, the normal block initial placing unit 25 and the normal block placement improving unit 26 will not be described more in detail. If desired, reference should be had to any one of several publications readily available. An example of such publications is the above-mentioned article contributed by Gary Robson.

Figure 3:
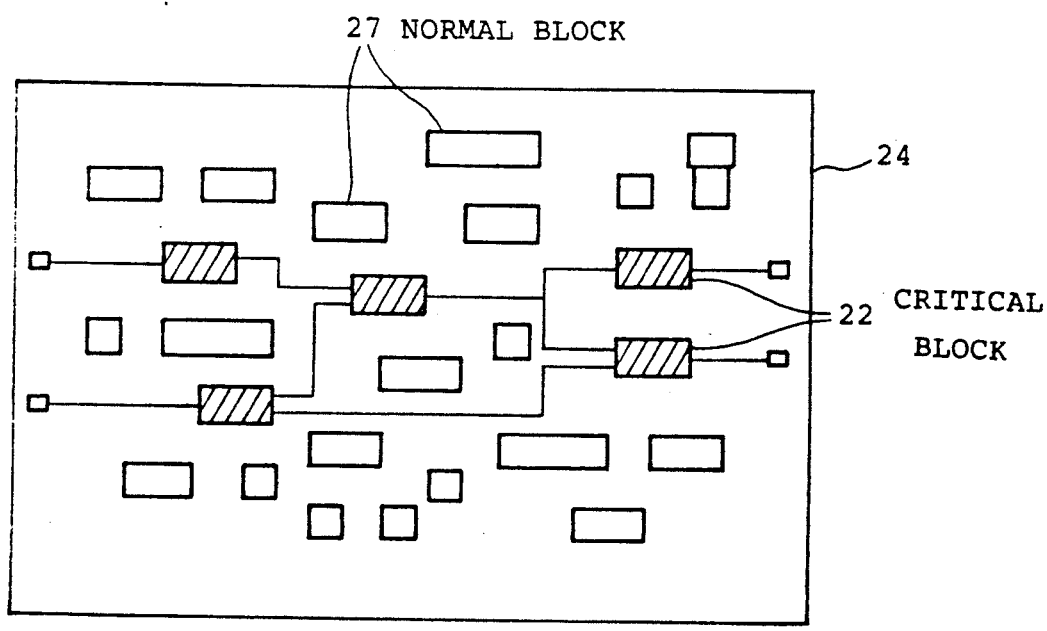
FIG. 3 shows the state of another placement condition when placement of all of functional blocks is completed.

Referring to FIG. 3, an example of the final normal block placement result is illustrated together with the final critical block placement result shown in FIG. 2. The final normal block placement result represents final placement of the normal blocks on the substantially plane area 24. In FIG. 3, each of the normal blocks is depicted at 27 and is represented by a blank block. It will be understood from FIG. 3 that each normal block 27 is placed around the critical blocks 22 on the substantially plane area.

What is claimed is:

1. A method of designing by computer a logic circuit comprising a plurality of functional blocks connected through path nets to place said functional blocks, including critical blocks, on a substantially plane area in response to logic connection information and under a circuit constraint, said logic connection information indicating connection between said functional blocks, said method comprising the steps of:
   extracting critical nets comprising predetermined parts of said path nets from said logic connection information, by critical net extracting means;
   extracting critical blocks connected to said critical nets from said logic connection information, by critical block extracting means;

initially placing said critical blocks on said substantially plane area to provide an initial critical block placement result, by critical block placing means;

checking whether or not said initial critical block placement result satisfies said circuit constraint, by checking means; and iteratively improving said initial critical block placement result until said circuit constraint is satisfied, by critical block placement improving means, if said initial critical block placement result does not satisfy said circuit constraint.

2. A method as claimed in claim 1 in which said functional blocks include normal blocks, said method further comprising the steps of:

initially placing normal blocks identical with said functional blocks except for said critical blocks on said substantially plane area to provide an initial normal block placement result, by normal block placing means, and improving said initial normal block placement result, by normal block placement improving means, if said initial normal block placement result does not satisfy said circuit constraint.

3. A computer aided design system for designing a logic circuit comprising a plurality of functional blocks connected through path nets to one another to place said functional blocks on a substantially plane area in response to logic connection information and under a circuit constraint, said logic connection information indicating connections between said functional blocks, said system comprising:

logic connection information memorizing means for memorizing said logic connection information as stored logic connection information;

critical net extracting means connected to said logic connection information memorizing means for extracting, as critical nets, predetermined parts of said path nets from said stored logic connection information to produce critical net information indicative of said critical nets;

critical net memorizing means connected to said critical net extracting means for memorizing said critical net information as stored critical net information;

critical block extracting means connected to said logic connection information memorizing means and to said critical net memorizing means for extracting critical blocks connected to said critical nets from said stored logic connection information in accordance with said stored critical net information to produce critical block information indicative of said critical blocks;

critical block initial placing means connected to said critical block extracting means and to said critical net memorizing means for carrying out initial placement of said critical blocks on said substantially plane area in accordance with said stored critical net information to produce initial critical block placement result information indicative of an initial critical block placement result;

critical block placement result memorizing means connected to said critical block initial placing means for memorizing, as stored critical block placement result information, one of said initial critical block placement result information and improved critical block placement result information;

circuit constraint memorizing means for memorizing circuit constraint information indicative of said circuit constraint as stored circuit constraint information;

critical block placement result checking means connected to said critical block placement result memorizing means and to said circuit constraint memorizing means for using said stored circuit constraint information in checking whether or not said stored critical block placement result information satisfies said circuit constraint, said critical block placement result checking means producing improvement indication information when said stored critical block placement result information does not satisfy said circuit constraint;

interative critical block placement improving means connected to said critical block placement result checking means and to said critical block placement result memorizing means for interatively improving said stored critical block placement result information in response to said improvement indication information to produce one of said improved critical block placement result information that indicates an improved critical block placement result; and supplying means connected to said iterative critical block placement improving means and to said critical block placement result memorizing means for supplying said critical block placement result memorizing means with said one of said improved critical block placement result information.

4. A computer aided design system as claimed in claim 3, wherein said critical block placement result checking means produces circuit constraint satisfaction information when said stored critical block placement result information satisfies said circuit constraint, and said system further comprising:

normal block initial placing means connected to said critical block placement result checking means and to said logic connection information memorizing means for carrying out initial placement of normal blocks identical with said functional blocks except for said critical blocks on said substantially plane area to provide initial normal block placement result information indicative of an initial normal block placement result; and normal block placement improving means connected to said normal block initial placing means for improving said initial normal block placement result information unitl normal block placement result information satisfies said circuit constraint.

5. A method designing by computer a logic circuit comprising a plurality of functional blocks connected through path nets to place said functional blocks on a substantially plane area in response to logic connection information and under a circuit constraint, said logic connection information indicating connections between said functional blocks, said method comprising the steps of:

extracting critical nets comprising predetermined parts of said path nets from said logic connection information, by critical net extracting means;

extracting critical blocks connected to said critical nets from said logic connection information, by critical block extracting means;

placing said critical blocks on said substantially plane area to provide a critical block placement result, by critical block placing means;

checking whether or not said critical block placement result satisfies said circuit constraint, by checking means; and iteratively improving said critical block placement result until said circuit constraint is satisfied, by improving means, if said checking step indicates said critical block placement result does not satisfy said circuit constraint.

6. A method as claimed in claim 5, said method further comprising the steps of:

placing normal blocks identical with said functional blocks except for said critical blocks on said substantially plane area to provide a normal block placement result, by normal block placing means; and improving said normal block placement result, by normal block placement improving means, until said normal block placement result satisfies said circuit constraint.

* * * * *